(12) United States Patent
Vimercati et al.

(10) Patent No.: US 9,042,190 B2
(45) Date of Patent: May 26, 2015

(54) APPARATUSES, SENSE CIRCUITS, AND METHODS FOR COMPENSATING FOR A WORDLINE VOLTAGE INCREASE

(71) Applicant: MICRON TECHNOLOGY, INC., Boise, ID (US)

(72) Inventors: Daniele Vimercati, Besana in Brianza (IT); Riccardo Muzzetto, Caponago (IT)

(73) Assignee: MICRON TECHNOLOGY, INC., Boise, ID (US)

( * ) Notice: Subject to any disclaimer, the term of this patent is extended or adjusted under 35 U.S.C. 154(b) by 139 days.

(21) Appl. No.: 13/775,868

(22) Filed: Feb. 25, 2013

(65) Prior Publication Data
US 2014/0241049 A1     Aug. 28, 2014

(51) Int. Cl.
| | |
|---|---|
| *G11C 7/00* | (2006.01) |
| *G11C 7/12* | (2006.01) |
| *G11C 13/00* | (2006.01) |
| *G11C 8/08* | (2006.01) |
| *G11C 7/14* | (2006.01) |
| *G11C 7/06* | (2006.01) |
| *G11C 29/02* | (2006.01) |
| *G11C 29/04* | (2006.01) |
| *G11C 29/12* | (2006.01) |

(52) U.S. Cl.
CPC ............... *G11C 7/12* (2013.01); *G11C 13/004* (2013.01); *G11C 7/062* (2013.01); *G11C 8/08* (2013.01); *G11C 13/00* (2013.01); *G11C 29/025* (2013.01); *G11C 29/028* (2013.01); *G11C 2029/0409* (2013.01); *G11C 2029/1202* (2013.01); *G11C 2029/1204* (2013.01); *G11C 7/14* (2013.01); *G11C 13/0004* (2013.01); *G11C 2013/0052* (2013.01); *G11C 2213/79* (2013.01)

(58) Field of Classification Search
CPC ......... G11C 7/12; G11C 7/062; G11C 13/004
USPC ........ 365/196, 189.07, 189.09, 194, 202, 207
See application file for complete search history.

(56) References Cited

U.S. PATENT DOCUMENTS

| | | | | | |
|---|---|---|---|---|---|
| 4,792,928 | A | * | 12/1988 | Tobita ........................ | 365/210.1 |
| 4,884,238 | A | * | 11/1989 | Lee et al. ...................... | 365/105 |
| 5,062,079 | A | * | 10/1991 | Tsuchida et al. .............. | 365/205 |

(Continued)

OTHER PUBLICATIONS

Choi, Youngdon et al., "A 20nm 1.8V 8Gb PRAM with 40MB/s Program Bandwidth", IEEE International ISSCC 2012, Session 2, Feb. 2012.

(Continued)

*Primary Examiner* — Viet Q Nguyen
(74) *Attorney, Agent, or Firm* — Dorsey & Whitney LLP

(57) ABSTRACT

Apparatuses, sense circuits, and methods for compensating for a voltage increase on a wordline in a memory is described. An example apparatus includes a bitline, a memory cell coupled to the bitline, a bipolar selector device coupled to the memory cell, a wordline coupled to the bipolar selector device, and a wordline driver coupled to the wordline. The apparatus further includes a model wordline circuit configured to model an impedance of the wordline and an impedance of the wordline driver, and a sense circuit coupled to the bitline and to the model wordline circuit. The sense circuit is configured to sense a state of the memory cell based on a cell current and provide a sense signal indicating a state of the memory cell. The sense circuit is further configured to adjust a bitline voltage responsive to an increase in wordline voltage as modeled by the model wordline circuit.

16 Claims, 5 Drawing Sheets

(56) References Cited

U.S. PATENT DOCUMENTS

| | | | |
|---|---|---|---|
| 6,356,481 B1 | 3/2002 | Micheloni et al. | |
| 6,411,557 B2 * | 6/2002 | Terzioglu et al. | 365/200 |
| 6,456,557 B1 | 9/2002 | Dadashev et al. | |
| 6,490,199 B2 | 12/2002 | Lee et al. | |
| 7,099,204 B1 | 8/2006 | Wadhwa et al. | |
| 7,366,040 B2 | 4/2008 | Chen | |
| 7,414,904 B2 * | 8/2008 | Ehrenreich et al. | 365/201 |
| 7,450,427 B2 * | 11/2008 | Yamada | 365/185.2 |
| 7,529,135 B2 | 5/2009 | Pan et al. | |
| 7,706,201 B2 * | 4/2010 | Liaw et al. | 365/210.1 |
| 7,724,075 B2 | 5/2010 | Yang et al. | |
| 7,936,626 B2 | 5/2011 | Chen | |
| 7,990,773 B2 | 8/2011 | Tran et al. | |
| 8,040,723 B2 | 10/2011 | Sheu et al. | |
| 8,050,084 B2 | 11/2011 | Bae et al. | |
| 8,159,869 B2 * | 4/2012 | Park et al. | 365/163 |
| 8,228,709 B2 | 7/2012 | Choi et al. | |
| 8,254,180 B2 | 8/2012 | Moei et al. | |
| 8,358,540 B2 | 1/2013 | Nguyen | |
| 8,824,191 B2 * | 9/2014 | Samachisa et al. | 365/148 |
| 8,885,399 B2 | 11/2014 | Storms et al. | |
| 2005/0117399 A1 | 6/2005 | Kwon et al. | |
| 2006/0181915 A1 | 8/2006 | Oh et al. | |
| 2007/0211537 A1 | 9/2007 | Park et al. | |
| 2008/0089130 A1 | 4/2008 | Park | |
| 2008/0205134 A1 | 8/2008 | Kato | |
| 2009/0080275 A1 | 3/2009 | Vo et al. | |
| 2009/0161411 A1 | 6/2009 | Kushida et al. | |
| 2010/0027320 A1 | 2/2010 | Muraoka et al. | |
| 2010/0054064 A1 | 3/2010 | Miyakawa et al. | |
| 2010/0067308 A1 | 3/2010 | Tran et al. | |
| 2010/0110798 A1 | 5/2010 | Hoei et al. | |
| 2011/0032746 A1 | 2/2011 | Maejima et al. | |
| 2011/0063920 A1 | 3/2011 | Moschiano et al. | |
| 2012/0075931 A1 | 3/2012 | Yuh | |
| 2012/0218817 A1 | 8/2012 | Kang et al. | |
| 2013/0051147 A1 | 2/2013 | Iwai | |
| 2014/0010032 A1 * | 1/2014 | Seshadri et al. | 365/203 |
| 2014/0064010 A1 * | 3/2014 | Barkley et al. | 365/226 |
| 2014/0104922 A1 | 4/2014 | Tiburzi et al. | |
| 2014/0241049 A1 | 8/2014 | Vimercati et al. | |

OTHER PUBLICATIONS

Son, Young-Suk et al., "A Gray-Level Dependent Pre-Emphasis Column Driver With Fast Settling for Active-Matrix LCD Application", IEEE Transactions on Circuits and Systems—II: Express Briefs, vol. 54, No. 12, Dec. 2007.

International Search Report and Written Opinion issued on May 22, 2014 for Application No. PCT/US14/15975.

* cited by examiner

APPARATUSES, SENSE CIRCUITS, AND METHODS FOR COMPENSATING FOR A WORDLINE VOLTAGE INCREASE

TECHNICAL FIELD

Embodiments of the invention relate generally to electronic memories, and more particularly, in one or more of the illustrated embodiments, to compensating for increasing wordline voltage caused by leakage currents from memory cell selectors.

DESCRIPTION OF RELATED ART

Certain memory architectures are susceptible to current leakage from a bitline through a bipolar selector device to a wordline during memory access operations. Current leakage through the bipolar selector device to the wordline can lead to an increased wordline voltage, which may cause fluctuations in current of a sense signal provided on the bitline. That is, an increased wordline voltage may reduce the voltage margin to accurately read the sense signal used to sense the data stored by a memory cell. As a result, the reduced voltage margin may lead to inaccurate reading of a memory cell.

DETAILED DESCRIPTION

Certain details are set forth below to provide a sufficient understanding of embodiments of the disclosure. However, it will be clear to one having skill in the art that embodiments of the disclosure may be practiced without these particular details. Moreover, the particular embodiments of the present disclosure described herein are provided by way of example and should not be used to limit the scope of the disclosure to these particular embodiments.

Figure 1:
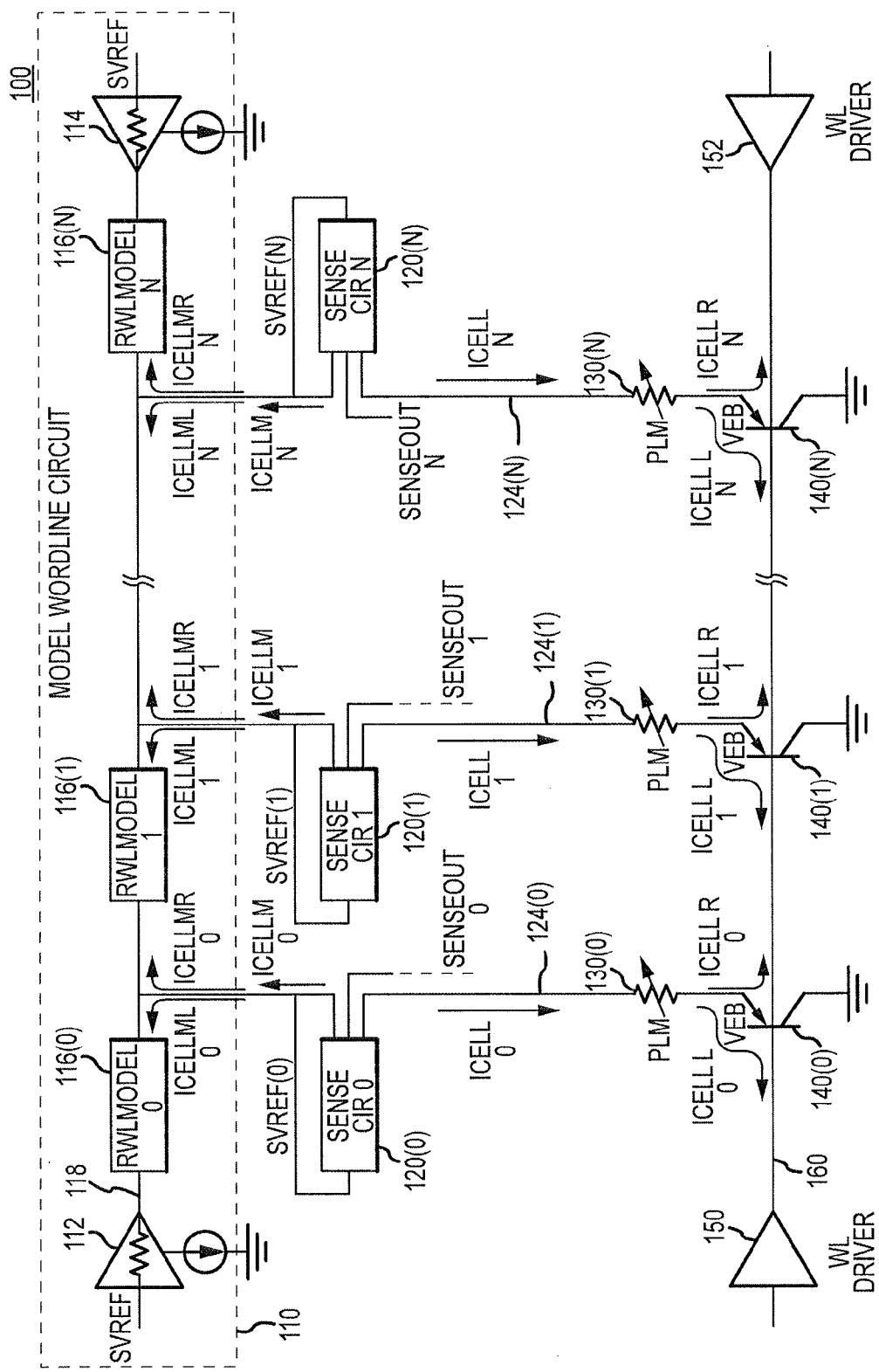
FIG. 1 is a block diagram of a particular illustrative embodiment of an apparatus including a model wordline circuit and sense circuit.

Referring to FIG. 1, a particular illustrative embodiment of an apparatus including a model wordline circuit and sense circuit is disclosed and generally designated 100. The apparatus may be an integrated circuit, a memory device, a memory system, an electronic device or system, a smart phone, a tablet, a computer, a server, etc. The apparatus 100 may compensate for a voltage increase on the wordline during a read operation due to current leakage through a selector device, such as a bipolar selector device. The apparatus 100 may include a plurality of bitlines 124(0-N). As illustrated in FIG. 1, each bitline 124(0-N) is coupled to a respective memory cell 130(0-N) that is coupled in series with a respective selector device 140(0-N). The selector devices 140(0-N) are illustrated in FIG. 1 as PNP bipolar junction transistors. Other types of circuits may be used for the selector devices 140(0-N) without departing from the scope of the present disclosure. Although FIG. 1 illustrates one memory cell 130(0-N) for each bitline 124(0-N), a plurality of memory cells may be coupled to each bitline. Embodiments of the disclosure may be used with bitlines coupled to one or more memory cells. A base of each selector device 140(0-N) may be coupled to a wordline 160. The apparatus 100 may further include a plurality of sense circuits 120(0-N) that are each configured to sense a respective cell current ICELL(0-N) flowing through the respective bitline 124(0-N). The respective ICELL(0-N) current indicates a state of the corresponding memory cell 130(0-N). Each of the sense circuits 120(0-N) compares the respective ICELL(0-N) current with current generated based on a reference voltage SVREF(0-N). The SVREF(0-N) voltage may be adjusted based on an impedance of a wordline and wordline driver. The SVREF(0-N) voltage may be adjusted by a model wordline circuit 110.

The model wordline circuit 110 may include a first model wordline driver 112 and a second model wordline driver 114, each coupled to a model wordline 118. The first model wordline driver 112 and the second model wordline driver 114 may each model at least one of a first wordline driver and a second wordline driver (e.g., wordline drivers 150 and 152) to drive a voltage on the model wordline 118. The model wordline 118 may be of a similar material and/or have similar electrical characteristics of the wordline 160. The model wordline resistance components 116(0-N) may model impedance along at least a portion of the wordline 160.

Each of the sense circuits 120(0-N) may be coupled to a respective bitline 124(0-N) and may be configured to may drive the respective ICELL(0-N) current along the respective bitline 124(0-N). Further, each of the sense circuits 120(0-N) may be coupled to the model wordline circuit 110 and may be configured to provide a respective model sense current ICELLM(0-N) to the model wordline 118. Each of the sense circuits 120(0-N) may also provide a respective sense out signal SENSE OUT(0-N) which may indicate the state of the respective memory cell 130(0-N).

Each of the memory cells 130(0-N) may be configured to store data. In an embodiment, each of the memory cells 130(0-N) may include a phase change memory material. The phase change memory material may be in one of at least two states, for example, an unprogrammed state and a programmed state. The phase change memory material may have a distinct impedance for each state. In an embodiment, the phase change memory material may include a chalcogenide alloy, such as an alloy of germanium, antimony and tellurium (GeSbTe), called GST.

In operation, during a memory access operation, each of the sense circuit 120(0-N) may precharge each respective bitline 124(0-N) to the SVREF voltage prior sensing. In addition, the first wordline driver 150 and the second wordline driver 152 drive an memory access voltage along the wordline 160 to enable each of the selector device 140(0-N). When a selector device 140(0-N) is enabled, the corresponding ICELL(0-N) current flows through the respective memory cell 130(0-N). The magnitude of the ICELL(0-N) current is based on the state (e.g., impedance) of the respective memory cell 130(0-N). Based on the respective ICELL(0-N) current, each of the sense circuits 120(0-N) may provide a respective SENSE OUT(0-N) signal. A magnitude of the SENSE OUT(0-N) signal indicates the state of the respective memory cell 130(0-N), and, accordingly, may indicate a data value stored by the respective memory cell 130(0-N).

The selector devices 140(0-N) may leak current through the bases to the wordline 160. For example, FIG. 1 depicts cell current ICELL L(0-N) and cell current ICELL R(0-N) leaking through the base of a selector device 140(0-N) to the wordline 160. The current leakage causes an increase in voltage of the wordline because the wordline 160, the first wordline driver 150, and the second wordline driver 152 have non-zero impedances. The wordline voltage increase may reduce base-emitter voltages VEB of the selector devices 140(0-N). As a consequence, the ICELL(0-N) current for each sense circuit 120(0-N) may be reduced. The magnitude of current leakage through the base of each selector device 140(0-N) may depend on a gain ($\beta$) of the selector device 140(0-N), an impedance of the wordline 160, an impedance of the first wordline driver 150 and the second wordline driver 152, and a state of the corresponding memory cell 130(0-N).

In some embodiments, compensation for increased wordline voltage resulting from the leakage current may be dynamically adjusted and may be based on several dependencies. For example, each of the sense circuits 120(0-N) may use the model wordline circuit 110 to compensate for the increased wordline voltage by modeling the increase in wordline voltage, and compensating (e.g., increasing) the SVREF voltage by an amount that is based on the voltage increase. Compensating the SVREF voltage may increase the ICELL currents, and, thus improve the voltage margin for sensing the ICELL currents.

To model the increase in wordline voltage, each of the sense circuits 120(0-N) drives a respective model cell current ICELL M(0-N) through the model wordline 118 and through at least one of the first wordline driver 112 and the second wordline driver 114, similar to the ICELL current of the wordline 160. For example, the ICELL M(0-N) current may be divided into two components, for example, model cell current ICELL ML(0-N) and model cell current ICELL MR(0-N). Responsive to the ICELL M( )-N) current driven through the model wordline 118 and through at least one of the first model wordline driver 112 and the second model wordline driver 114 by a corresponding sense circuit 120(0-N), the corresponding sense circuit 120(0-N) may use a voltage differential along the model wordline 118 (e.g., based on the model wordline resistance 116(0-N) and an impedance of the first model wordline driver 112 and the second model wordline driver 114) to adjust (e.g., increase) the corresponding SVREF(0-N) voltage. Responsive to adjustment of the corresponding SVREF(0-N) voltage by the corresponding sense circuit 120(0-N), the corresponding ICELL(0-N) current along the respective bitline 124(0-N) is adjusted (e.g., increased). Increasing, for example, the ICELL(0-N) current (responsive to the adjusted corresponding SVREF(0-N)) to compensate for the increased wordline voltage may increase the accuracy of the data sensed from a memory cell 130(0-N) during a read operation.

While FIG. 1 depicts the apparatus 100 with at least three bitlines 124(0-N), the apparatus 100 may include any number of bitlines. Similarly, although one wordline 160, and associated wordline drivers 150, 152, and selector devices 140(0-N) are illustrated in FIG. 1, the apparatus may include any number of wordlines, and associated wordline drivers, and selector devices. Also, each of the model wordline resistance components 116(0-N) may represent impedance of a portion of the model wordline 118.

Compensating for increased wordline voltage, which may cause a decrease in the sense signal, by using the model wordline circuit 110 may increase the voltage margin for sensing the ICELL currents, and improve sense accuracy of each of the sense circuits 120(0-N). The sense circuits 120(0-N), in conjunction with the model wordline circuit 110, may provide a dynamic compensation solution by using a model of the respective ICELL(0-N) current through the bitline to determine the increased current.

Figure 2:
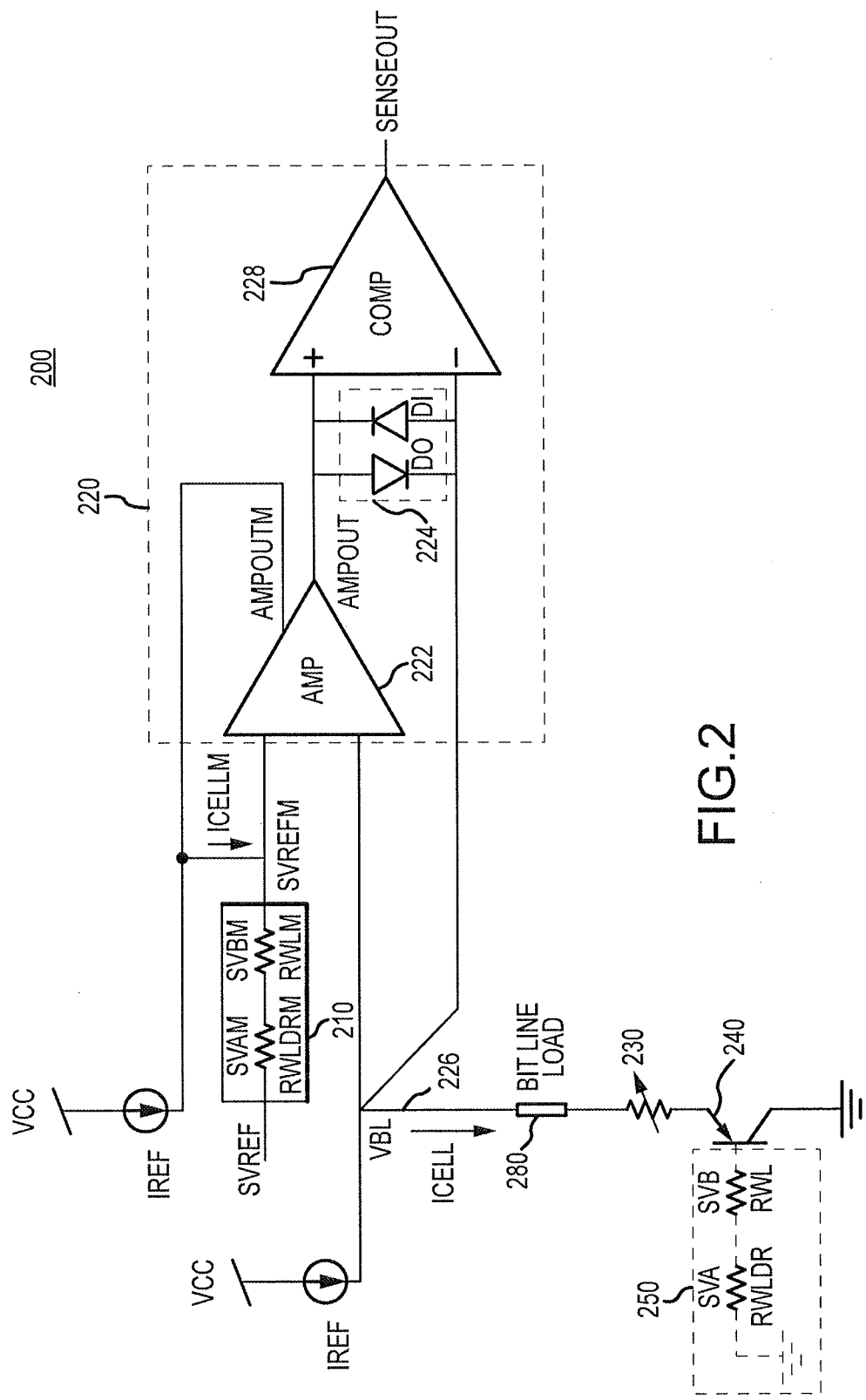
FIG. 2 is a block diagram of a particular illustrative embodiment of an apparatus including a model wordline circuit and sense circuit.

Referring to FIG. 2, a particular illustrative embodiment of an apparatus including a model wordline circuit and sense circuit is disclosed and generally designated 200. The apparatus 200 may represent a single sense circuit for a single bitline. The apparatus 200 may include a sense circuit 220 that uses a wordline model circuit 210 to provide an adjusted sense reference voltage signal SVREFM to compensate for increased wordline voltage which may be caused by current leakage along the wordline. The sense circuit 220 is coupled to a memory cell 230 though a bitline 226. An impedance of the bitline is represented by bitline load 280. A selector device 240, such as a bipolar selector device, is coupled to the memory cell 230 and is configured to select the memory cell 230 for memory access responsive to being activated by a wordline coupled to a base of the selector device 240. The wordline and associated wordline driver are represented by wordline and driver(s) 250 as impedances RWLDR and RWL. The wordline model circuit 210 includes a RWLDRM component and a RWLM resistive component to model the impedances RWLDR and RWL, respectively, of the wordline driver(s) and wordline 250. The RWLDRM component may model the RWLDR impedance and a gain ($\beta$) of the selector device 240. For example, an impedance of the RWLDRM component may be approximately equal to RWLDR/($\beta$+1). The RWLM resistive component may model the RWL impedance and the $\beta$ gain of the bipolar device 240. For example, an impedance of the RWLM resistive component may be approximately equal to RWL/($\beta$+1). The RWLDR impedance may represent a word line driver impedance, such as an impedance of at least one of the first wordline driver 150 and the second wordline driver 152 of FIG. 1. The RWL impedance may present at least a portion of impedance of a wordline, such as at least a portion of an impedance of the wordline 160 of FIG. 1.

The sense circuit 220 also provides an sense output signal SENSEOUT based on a comparison between a voltage of an amplifier output signal AMPOUT and a bitline voltage VBL. The sense circuit 220 may include an amplifier 222 to provide the AMPOUT signal, and further include a comparator 228 to perform the comparison. The model wordline circuit 210 may include at least a portion of the model wordline circuit 110 of FIG. 1. The sense circuit 220 may include one of the sense circuits 120(0-N) of FIG. 1. The memory cell 230 and the selector device 240 may include at least one of the memory cells 130(0-N) and the selector devices 140(0-N), respectively, of FIG. 1. The wordline and driver(s) 250 may include at least a portion of the first wordline driver 150, the second wordline driver 152 and the wordline 160 of FIG. 1.

The amplifier 222 may be a differential amplifier configured to receive the SVREFM voltage from the model wordline circuit 210 at a first input. The amplifier 222 may be further configured to receive a bitline voltage VBL at a second input. The amplifier 222 may produce the AMPOUT signal at a first output and an model amplifier output signal AMPOUTM at a second output, each based on the first input and the second input. The AMPOUTM signal may be fed back to the first input of the amplifier 222. In an embodiment, the AMPOUTM signal is approximately equal to the AMPOUT signal.

The comparator 228 may be configured to receive the AMPOUT signal at a first input and to receive the VBL voltage at a second input. The first input of the comparator 228 may be coupled to the second input of the comparator 228 via the limiter circuit 224. The AMPOUT signal may be fed back to the bitline via the limiter circuit 224. In an embodiment, the limiter circuit 224 may include a diode pair coupled in parallel, with the diode D0 having a forward direction from the first input to the second input and a diode D1 having a forward direction from the second input to the first input. In an alternative embodiment, the limiter circuit 224 may include a resistive component. The limiter circuit 224 may limit a voltage differential between the first input and the second input.

In operation, a reference current IREF is provided to the bitline 226. The IREF current is a constant current provided to the bitline during a read operation. Based on the reference current, the bitline 226 is precharged to approximately the SVREF voltage (e.g., the VBL voltage is approximately equal to the SVREF voltage) via the AMPOUT signal of the amplifier 222 provided to the bitline 226 through the D0 diode of the limiter circuit 224. The SVREF voltage may be approximately equal to the SVREFM voltage. When the selector device 240 is enabled, an ICELL current, which may depend on the state of the memory cell and the IREF current, begins to flow through the bitline 226. As the ICELL current flows, current may leak through the base of the selector device 240 through the wordline and driver(s) 250. The current leakage may cause an increase in wordline voltage (e.g., near the base of the selector device 240), and consequently, may result in a reduction in read margin. The increase in wordline voltage may be equivalent to a voltage SVA across a word line driver impedance RWLDR, plus a voltage SVB across a word line impedance RWL.

The amplifier 222 provides an AMPOUTM signal responsive to the increase in wordline voltage that causes a model cell current ICELLM to flow through the wordline model circuit 210. The ICELLM current flowing through the wordline model circuit 210 may cause a voltage of the SVREFM signal to change by the sum voltage of SVAM and SVBM. The change in the SVREFM signal models the increase in wordline voltage due to the current leakage through the base of the selector device 240 (e.g., SVA+SVB). The amplifier 222 responds by providing an AMPOUT signal that adjusts the VBL voltage (through the limiter circuit 224) to compensate for the increased wordline voltage (e.g., VBL=SVREF+SVA+SVB). The comparator 228 may compare the voltage of the AMPOUT signal to the VBL voltage responsive to selection by the selector device 240 and provide the SENSEOUT signal. The SENSE OUT signal may represent a state (e.g., impedance) of the memory cell 230.

In an embodiment, the first input of the amplifier 222 is a non-inverting input. Thus, feeding back the AMPOUTM signal to the first input of the amplifier 222 forms a positive feedback system. To prevent instability (e.g., oscillation) in the positive feedback system, the RWLDRM impedance and/or the RWLM impedance may be adjusted to result in a feedback gain of the positive feedback system of less than one. An example of adjusting the model wordline driver impedance is discussed further with reference to FIG. 4.

The sense circuit 220 could be replicated for a plurality of bitlines in an array, such as the apparatus of claim 1. Also as would be obvious to one of ordinary skill in the art, the RWL impedance and the RWLDR impedance may vary for each bitline based on a location along the wordline and variances in characteristics of each individual bipolar device 240.

Figure 3:
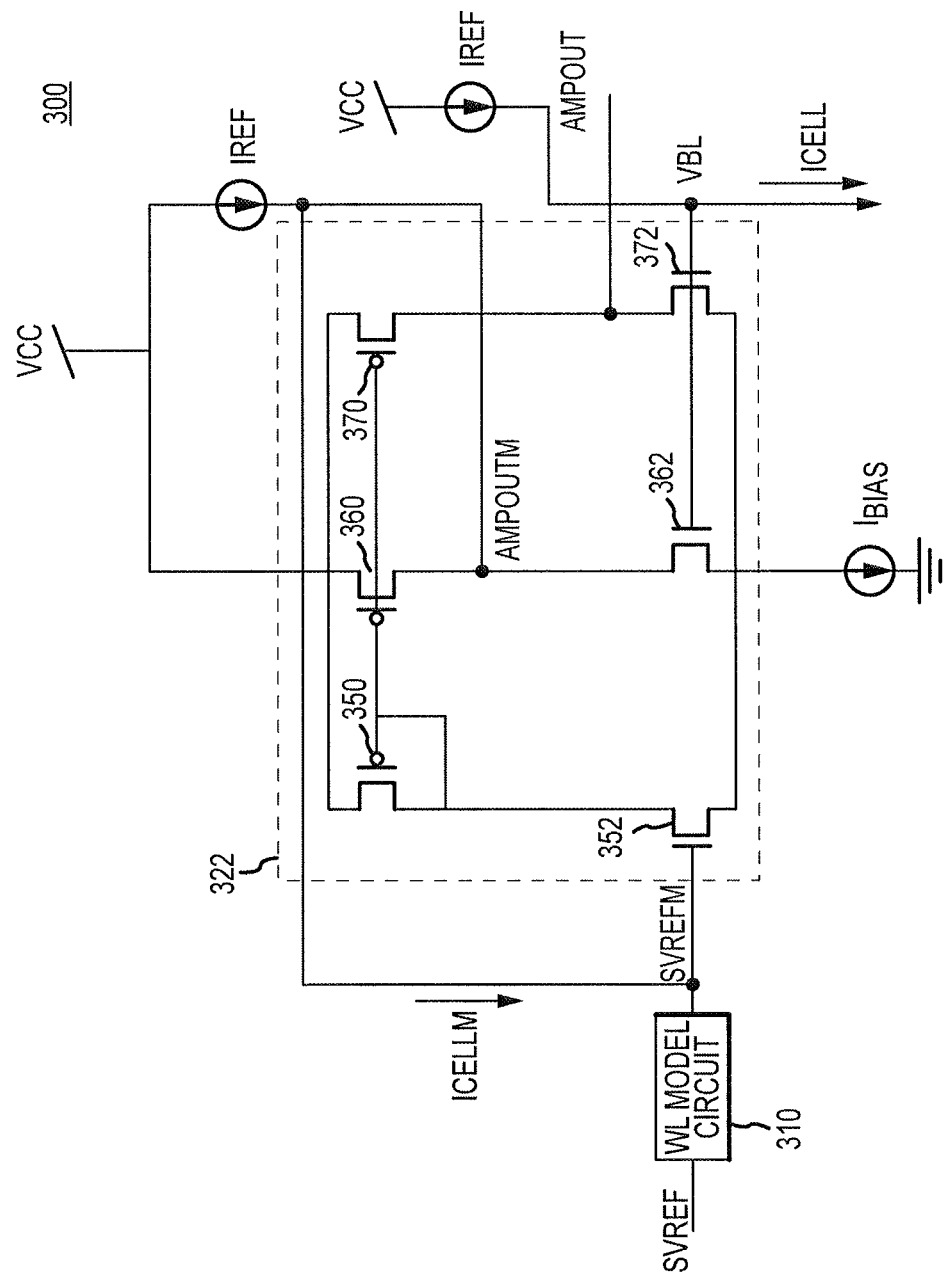
FIG. 3 is a block diagram of a particular illustrative embodiment of a dual output amplifier circuit.

Referring to FIG. 3, a particular illustrative embodiment of a dual output amplifier circuit is disclosed and generally designated 300. The dual output amplifier circuit 300 may include an amplifier 322. The amplifier 322 may be configured to receive an adjusted sense reference voltage signal SVREFM from a model wordline circuit 310 at a first input and a bitline voltage VBL at a second input. The amplifier 322 may also be configured to provide an amplifier output signal AMPOUT from a first output and an model amplifier output signal AMPOUTM from a second output. The model wordline circuit 310 may include at least a portion of the model wordline circuit 110 of FIG. 1, and/or the model wordline circuit 210 of FIG. 2. The amplifier 322 may include the amplifier 222 of FIG. 2, and may be included in the sense circuit 120 of FIG. 1 and/or the sense circuit 220 of FIG. 2.

The amplifier 322 may be a differential amplifier configured to receive the SVREFM voltage from the model wordline circuit 310 at a gate of a second transistor 352 and a bitline voltage VBL at a gate of a fourth transistor 362 and a gate of a sixth transistor 372. The amplifier 322 may be provide the AMPOUT signal at a first output node between a third transistor 360 and the fourth transistor 362 and the AMPOUTM signal at a second output node between a fifth transistor 370 and the sixth transistor 372. The AMPOUT and the AMPOUTM signals may each be based on the first input and the second input. The AMPOUTM signal may be fed back to the gate of the second transistor 352. In an embodiment, the AMPOUTM signal is approximately equal to the AMPOUT signal.

The second transistor 352 and a first transistor 350 may form a first current mirror circuit with the fourth transistor 362 and the third transistor 360. For example, the first transistor 350 coupled in series with the second transistor 352. A source of the first transistor 350 is configured to receive a first power source (e.g., a VCC power source) and a source of the second transistor 352 is configured to receive a second power source (e.g., a ground power source). A gate of the first transistor 350 is coupled to the drain of the second transistor 352. A gate of the second transistor 352 is configured to receive the SVREFM voltage that is adjusted by the model wordline circuit 310. A source of the third transistor 360 is configured to receive the first power source and a source of the fourth transistor 362 is configured to receive the second power source. A gate of the third transistor 360 is coupled to the gate of the first transistor 350 and a gate of the fourth transistor 362 is configured to receive the VBL voltage. The AMPOUTM signal may be provided at a node between the third transistor 360 and the fourth transistor 362. The AMPOUTM signal is fed back to the gate of the second transistor 352.

Additionally, the second transistor 352 and a first transistor 350 may form a second current mirror circuit with the sixth transistor 372 and the fifth transistor 370. For example, the fifth transistor 370 is coupled in series with the sixth transistor 372. A source of the fifth transistor 370 is configured to receive the first power source and a source of the sixth transistor 372 is configured to receive the second power source. A gate of the fifth transistor 370 is coupled to the gate of the first transistor 350 and a gate of the sixth transistor 372 configured to receive the VBL voltage. The AMPOUT signal is provided at a node between the fifth transistor 370 and the sixth transistor 372. In an embodiment, the first current mirror circuit is nearly identical to the second current mirror circuit.

As would be obvious to one ordinarily skilled in the art, the amplifier 322 could be implemented using other amplifier architectures, such as an amplifier using bipolar junction transistors. The amplifier 322 may provide the AMPOUT signal and the AMPOUTM signal having characteristics that attempt to equalize the VBL voltage received at the gate of the sixth transistor 372 and/or the fourth transistor 362 with the SVREFM voltage received at the gate of the second transistor 352.

Figure 4:
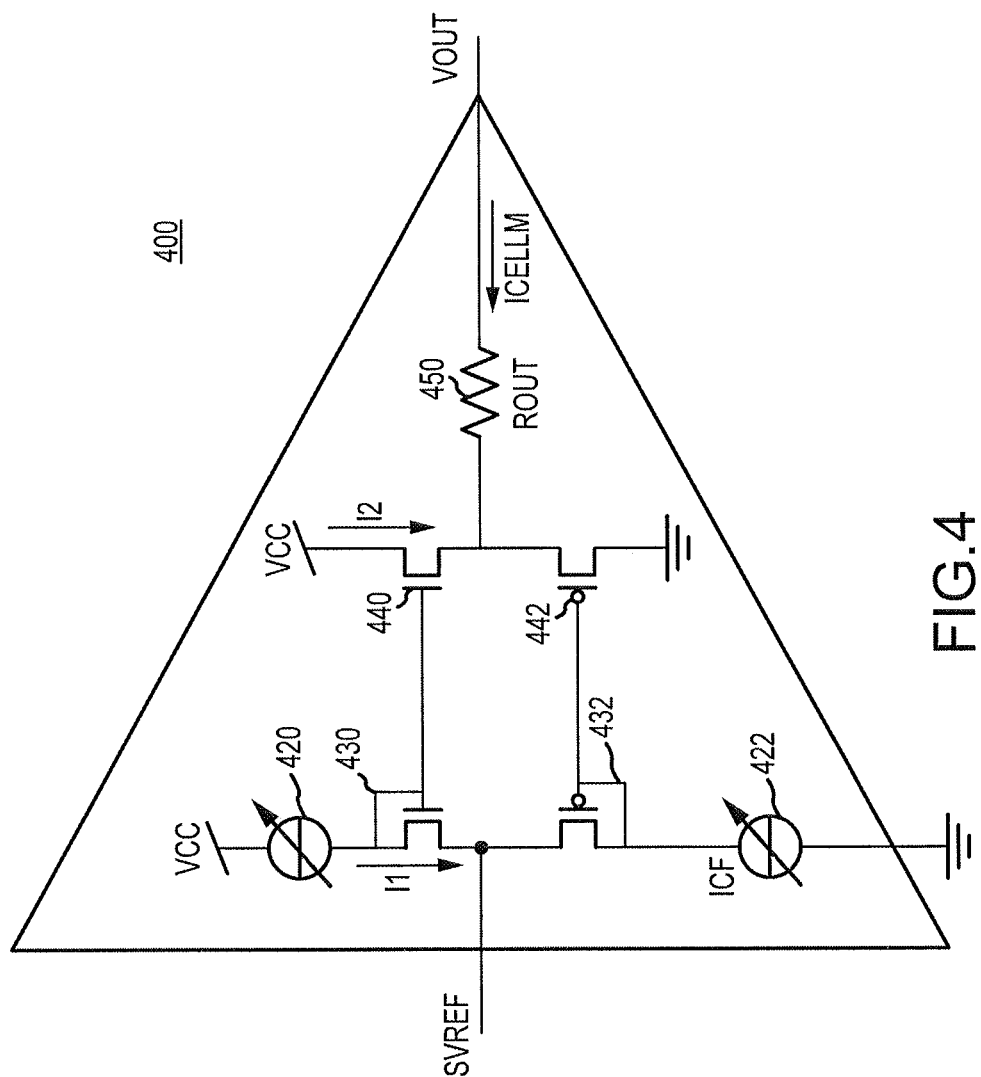
FIG. 4 is a block diagram of a particular illustrative embodiment of a model wordline driver.

Referring to FIG. 4, a particular illustrative embodiment of an model wordline driver is disclosed and generally designated model wordline driver 400. The model wordline driver 400 may be configured to model a wordline driver impedance. The model wordline driver 400 may be configured to receive a sense reference voltage signal SVREF and provide an output voltage VOUT. The model wordline driver 400 may include the first model wordline driver 112 and/or the second model wordline driver 114 of FIG. 1. The model wordline driver 400 may be included in the RWLDRM component of the model wordline circuit 210 of FIG. 2, and/or the model wordline circuit 310 of FIG. 3.

The model wordline driver 400 may be a follower circuit that includes a first transistor 430 and a second transistor 432 coupled in series, and further includes and a third transistor 440 and a fourth transistor 442 coupled in series. A drain of the first transistor 430 is coupled to a first power source (e.g., a VCC power source) via a first current regulator 420 and a drain of the second transistor 432 is coupled to a second power source (e.g., a ground power source) via a second current regulator 422. A gate of the first transistor 430 may be coupled to the drain of the first transistor 430. A gate of the second transistor 432 may be coupled to the drain of the second transistor 432.

A drain of the third transistor 440 is coupled to the first power source and a drain of the fourth transistor 442 is coupled to the second power source. A gate of the third transistor 440 may be coupled to the gate of the first transistor 430. A gate of the fourth transistor 442 may be coupled to the gate of the second transistor 432. An output resistance ROUT 450 may be coupled to a node between the third transistor 440 and the fourth transistor 442, and the VOUT voltage may be provided via the ROUT 450. The ROUT 450 may be configured to model an impedance at an output of a wordline driver, such as the wordline drivers 150 and 152 of FIG. 1.

In operation, the SVREF voltage is received at a node between the first transistor 430 and the second transistor 432. A current I1 along a path through the first transistor 430 and the second transistor 432 is controlled by a first current regulator 420 and a second current regulator 422. A current I2 flows along a path through the third transistor 440. A model cell current ICELLM flows through the ROUT resistance 450 and into a node between the third transistor 440 and the fourth transistor 442. Thus, a current including the current I2 plus the ICELLM current flows through the fourth transistor 442. The current I1 is adjusted to control the current flowing through the fourth transistor 442. A voltage differential between the SVREF voltage and the VOUT voltage may be indicative of an apparent resistance through the fourth transistor 442 that models a impedance associated with a word line driver.

The second current regulator 422 may be implemented using other voltage control circuits or adjustable resistance circuits to model the resistance of the word line driver.

Figure 5:
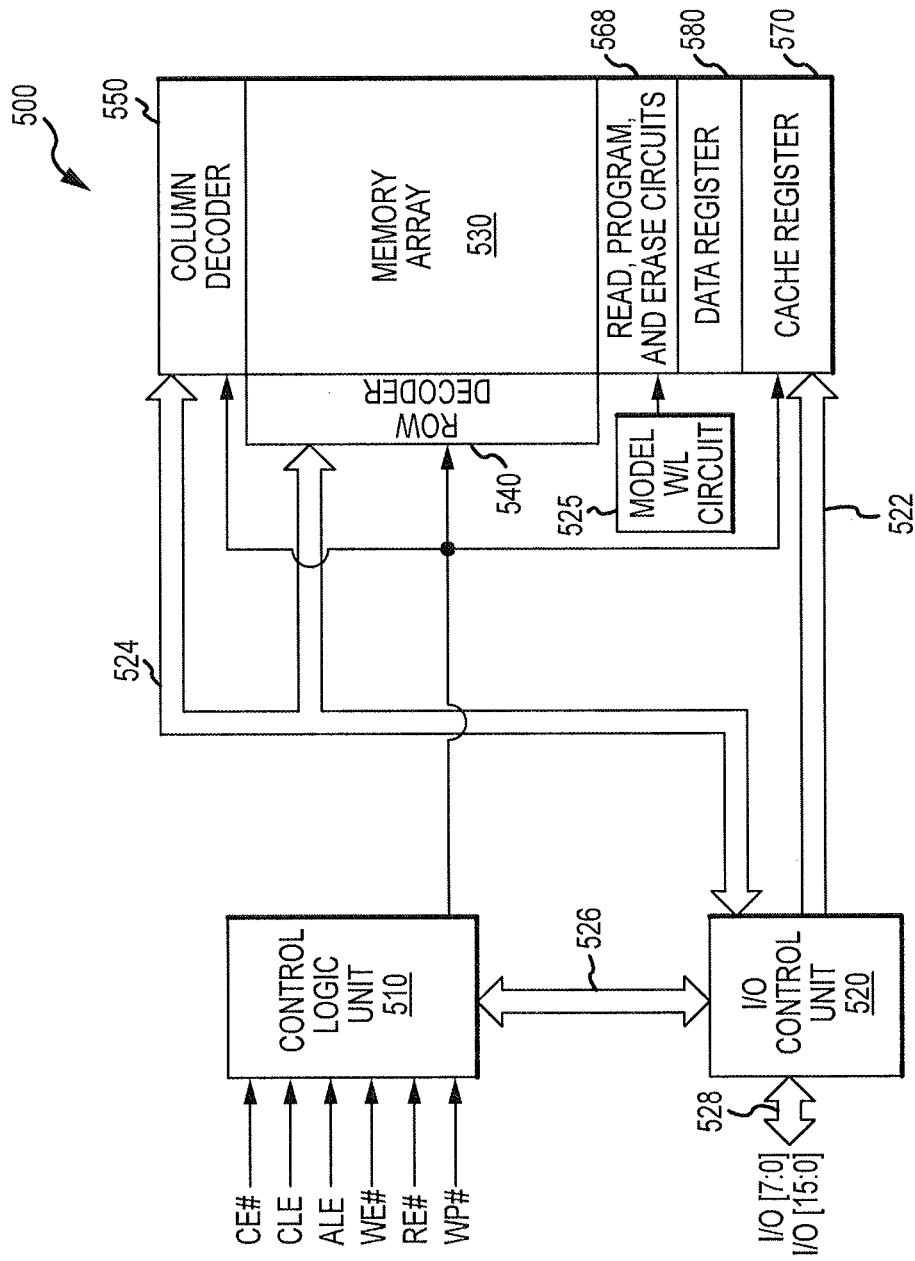
FIG. 5 is a block diagram of a memory including a model wordline circuit and sense circuit according to an embodiment of the disclosure.

FIG. 5 illustrates a memory 500 according to an embodiment of the present invention. The memory 500 includes a memory array 530 with a plurality of memory cells. The memory cells may be non-volatile memory cells, such as NAND flash cells, phase change memory cells, or may generally be any type of memory cells.

Command signals, address signals and write data signals may be provided to the memory 500 as sets of sequential input/output ("I/O") signals transmitted through an I/O bus 528. Similarly, read data signals may be provided from the memory 500 through the I/O bus 528. The I/O bus 528 is connected to an I/O control unit 520 that routes the signals between the I/O bus 528 and an internal data bus 522, an internal address bus 524, and an internal command bus 526. The memory 500 also includes a control logic unit 510 that receives a number of control signals either externally or through the command bus 526 to control the operation of the memory 500.

The address bus 524 applies block-row address signals to a row decoder 540 and column address signals to a column decoder 550. The row decoder 540 and column decoder 550 may be used to select blocks of memory or memory cells for memory operations, for example, read, program, and erase operations. The column decoder 550 may enable write data signals to be applied to columns of memory corresponding to the column address signals and allow read data signals to be coupled from columns corresponding to the column address signals.

In response to the memory commands decoded by the control logic unit 510, the memory cells in the array 530 are read, programmed, or erased. Read, program, and erase circuits 568 coupled to the memory array 530 receive control signals from the control logic unit 510 and include current generators for generating various reference currents for read, program and erase operations. The read, program and erase circuits 568 may be coupled to a model wordline circuit 525. The model wordline circuit 525 may include the model wordline circuit 110 of FIG. 1, the model wordline circuit 210 of FIG. 2, the model wordline circuit 310 of FIG. 3, the model wordline driver 400 of FIG. 4 and/or any combination thereof. For example, the model wordline circuit 525 may be configured to compensate for current leakage along a wordline by modeling corresponding impedance of a wordline and a wordline driver to increase a corresponding cell current flowing through a memory cell used a read operation. The read, program and erase circuits 568 may include the sense circuit 120(0-N) of FIG. 1, the sense circuit 220 of FIG. 2, the amplifier 322 of FIG. 3, and/or any combination thereof. In addition to the signal line drivers in the row decoder 540 and/or column decoder 550, one or more of the voltage generators or other read, program, and erase circuits 568 may also include signal line drivers.

After the row address signals have been applied to the address bus 524, the I/O control unit 520 routes write data signals to a cache register 570. The write data signals are stored in the cache register 570 in successive sets each having a size corresponding to the width of the I/O bus 528. The cache register 570 sequentially stores the sets of write data signals for an entire row or page of memory cells in the array 530. All of the stored write data signals are then used to program a row or page of memory cells in the array 530 selected by the block-row address coupled through the address bus 524. In a similar manner, during a read operation, data signals from a row or block of memory cells selected by the block-row address coupled through the address bus 524 are stored in a data register 580. Sets of data signals corresponding in size to the width of the I/O bus 528 are then sequentially transferred through the I/O control unit 520 from the data register 580 to the I/O bus 528.

Those of ordinary skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends on the particular application and design constraints imposed on the overall system. Skilled artisans may implement the described functionality in varying ways for each particular application, but such implementation decisions should not be interpreted as causing a departure from the scope of the present disclosure.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. An apparatus comprising:
   a bitline;
   a memory cell coupled to the bitline;
   a selector device coupled to the memory cell;
   a wordline coupled to a base of the bipolar selector device;
   a wordline driver coupled to the wordline;
   a model wordline circuit configured to model an impedance of the wordline and an impedance of the wordline driver; and
   a sense circuit coupled to the bitline and to the model wordline circuit, the sense circuit configured to sense a state of the memory cell based on a cell current and provide a sense signal indicating a state of the memory cell, the sense circuit further configured to adjust a bitline voltage responsive to an increase in wordline voltage as modeled by the model wordline circuit.

2. The apparatus of claim 1, wherein the sense circuit comprises a comparator configured to compare the bitline voltage with a voltage of an amplifier output signal, wherein the amplifier output signal is based on the adjusted bitline voltage.

3. The apparatus of claim 2, wherein the comparator receives the amplifier output signal at a first input and receives the bitline voltage at a second input, wherein the first input is coupled to the second input by a limiter circuit.

4. The apparatus of claim 3, wherein the limiter circuit comprises a diode pair.

5. The apparatus of claim 2, wherein the sense circuit further comprises an amplifier configured to provide the amplifier output signal based on the bitline voltage and the wordline voltage as modeled by the model wordline circuit, wherein the bitline voltage is received at a first input of the amplifier and the wordline voltage as modeled by the model wordline circuit is received at a second input of the amplifier.

6. The apparatus of claim 5, wherein the amplifier is further configured to provide a model amplifier output signal based on the bitline voltage and the wordline voltage as modeled by the model wordline circuit, wherein the model amplifier output signal is fed back to the first input of the amplifier.

7. The apparatus of claim 6, wherein the amplifier is a differential amplifier.

8. The apparatus of claim 1, wherein the memory cell comprises a phase change memory cell.

9. The apparatus of claim 1, wherein the selector device comprises a bipolar junction transistor.

10. The apparatus of claim 1, wherein the model wordline circuit comprises:
    a resistive component configured to model the impedance of at least a portion of the wordline, the resistive component coupled to the sense circuit to provide an output voltage; and
    a follower circuit coupled in series with the resistive component, the follower circuit configured to receive a sense reference voltage, the follower circuit configured to model the impedance of the wordline driver, wherein a voltage differential between the sense reference voltage and an output voltage caused by a model memory cell current through the resistive component and the follower circuit represents a voltage drop across the at least a portion of the wordline and the wordline driver.

11. The apparatus of claim 10, wherein an impedance of the resistive component and an impedance of the follower circuit are each further based on a gain of the bipolar selector device.

12. The apparatus of claim 11, wherein the impedance of the follower circuit is adjustable.

13. The apparatus of claim 11, wherein the follower circuit comprises;
    a first transistor coupled in series with a second transistor, wherein a drain of the first transistor is coupled to a first power source via a first current regulator and a drain of the second transistor is coupled to a second power source via a second current regulator, wherein a gate of the first transistor is coupled to the drain of the first transistor and wherein a gate of the second transistor is coupled to the drain of the second transistor, wherein the sense reference voltage is received at a node between the first transistor and the second transistor; and
    a third transistor coupled in series with a fourth transistor, wherein a drain of the third transistor is coupled to the first power source and a drain of the fourth transistor is coupled to the second power source, wherein a gate of the third transistor is coupled to the gate of the first transistor and a gate of the fourth transistor is coupled to the gate of the second transistor, wherein the follower circuit is configured to provide a follower circuit output to the resistive component at a node between the third transistor and the fourth transistor, wherein the output is controlled by at least one of the first current regulator and the second current regulator.

14. A method, comprising:
    receiving a sense reference voltage at a model wordline circuit, wherein an impedance of the model wordline circuit is approximately equal to an impedance of at least a portion of a wordline and wordline driver of a memory array;
    providing a model cell current through the model wordline circuit;
    adjusting the sense reference voltage based on the sense reference voltage plus a voltage based on the model cell current flowing through the model wordline circuit.

15. The method of claim 14, further comprising adjusting an impedance of the model wordline circuit based on a gain of an amplifier of the sense circuit.

16. The method of claim 15, wherein adjusting the impedance of the model wordline circuit comprises controlling; a current regulator of a follower circuit.

* * * * *